(12) United States Patent
Frankowsky

(10) Patent No.: US 7,434,125 B2
(45) Date of Patent: Oct. 7, 2008

(54) INTEGRATED CIRCUIT, TEST SYSTEM AND METHOD FOR READING OUT AN ERROR DATUM FROM THE INTEGRATED CIRCUIT

(75) Inventor: Gerd Frankowsky, Hoehenkirchen-Siegertsbrunn (DE)

(73) Assignee: Infineon Technologies AG, Munich (DE)

( * ) Notice: Subject to any disclaimer, the term of this patent is extended or adjusted under 35 U.S.C. 154(b) by 212 days.

(21) Appl. No.: 11/415,443

(22) Filed: May 1, 2006

(65) Prior Publication Data
US 2006/0262614 A1 Nov. 23, 2006

Related U.S. Application Data

(63) Continuation of application No. PCT/EP2004/011687, filed on Oct. 16, 2004.

(30) Foreign Application Priority Data
Oct. 29, 2003 (DE) ................. 103 50 356

(51) Int. Cl.
*G01R 31/28* (2006.01)
(52) U.S. Cl. .................................. 714/724
(58) Field of Classification Search ................ 714/718, 714/733, 742, 724
See application file for complete search history.

(56) References Cited

U.S. PATENT DOCUMENTS

| | | |
|---|---|---|
| 6,026,038 A | 2/2000 | Cho et al. |
| 6,424,576 B1 * | 7/2002 | Antosh et al. .......... 365/189.05 |
| 6,543,015 B1 * | 4/2003 | Wang et al. .................. 714/718 |
| 6,930,936 B2 * | 8/2005 | Santin ......................... 365/201 |
| 7,055,076 B2 * | 5/2006 | Roohparvar ................. 714/718 |
| 2004/0044932 A1 * | 3/2004 | Roohparvar ................. 714/718 |
| 2004/0260988 A1 * | 12/2004 | Kobayashi ................... 714/719 |

FOREIGN PATENT DOCUMENTS

| | | |
|---|---|---|
| EP | 0416714 | 3/1991 |
| WO | 9913475 | 3/1999 |

OTHER PUBLICATIONS

PCT International Search Report dated Feb. 21, 2005 for PCT/EP2004/011687.

* cited by examiner

*Primary Examiner*—James C Kerveros
(74) *Attorney, Agent, or Firm*—Patterson & Sheridan, L.L.P.

(57) ABSTRACT

An integrated circuit is provided, the integrated circuit having a test circuit for reading out an error datum from the integrated circuit in accordance with a test mode, wherein the error datum is output via a first and a second data output, and wherein an address and a read command are applied to the integrated circuit to read out the error datum associated with the address via one of the data outputs. The test circuit is configured in such a manner that, when a first read command is applied, the test circuit outputs the error datum at the first data output and switches the second data output to high impedance and, when a second read command is applied, the test circuit outputs the error datum at the second data output and switches the first data output to high impedance.

19 Claims, 4 Drawing Sheets

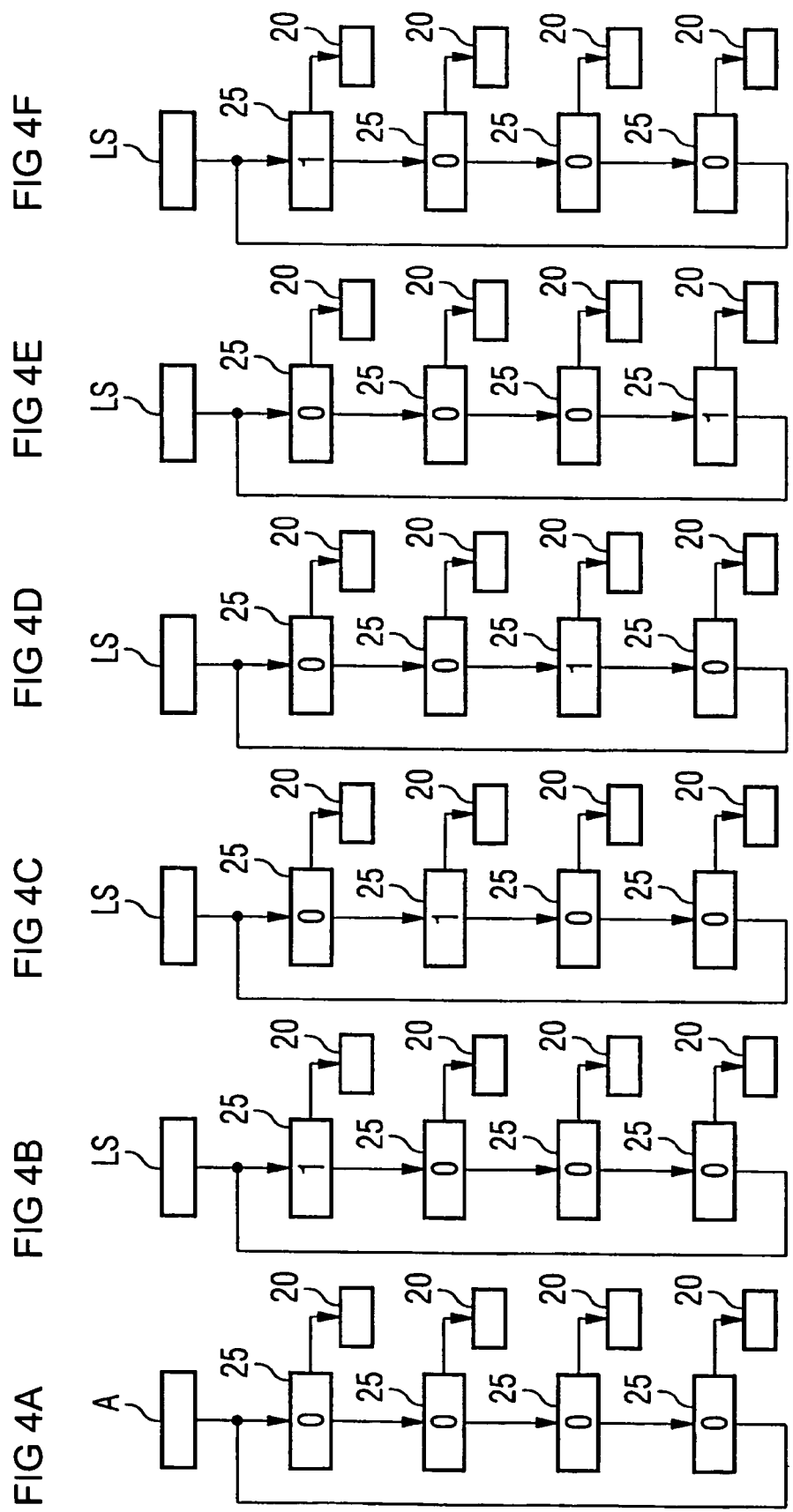

INTEGRATED CIRCUIT, TEST SYSTEM AND METHOD FOR READING OUT AN ERROR DATUM FROM THE INTEGRATED CIRCUIT

CROSS-REFERENCE TO RELATED APPLICATIONS

This application is a continuation of co-pending PCT patent application No. PCT/EP04/011687, filed Oct. 16, 2004, which claims the benefit of German patent application serial number DE 103 50 356.0, filed Oct. 29, 2003. Each of the aforementioned related patent applications is herein incorporated by reference in its entirety.

BACKGROUND OF THE INVENTION

1. Field of the Invention

The invention relates to an integrated circuit from which an error datum is to be read out in accordance with a test mode. The invention also relates to a test system in which a plurality of integrated circuits are to be tested in parallel and error data are to be read out from the integrated circuits. The invention also relates to a method for reading out error data from integrated circuits.

2. Description of the Related Art

Integrated circuits are frequently tested in parallel by connecting the integrated circuits to a tester unit for a test system. In the case of a burn-in operation, in particular, the integrated circuits are simultaneously tested under extreme operating conditions in order to pre-age them.

As a result of the fact that it is necessary to test the integrated circuits simultaneously, a large number of parallel-routed tester channels are needed to connect the address connections, command connections and, in particular, the data connections of the integrated circuits to the tester unit. Particularly in the case of a very large number of integrated circuits which are to be simultaneously tested, it is therefore necessary to use these tester channels as economically as possible. Reducing the number of tester channels also makes it possible to increase the number of integrated circuits which can be simultaneously tested.

The integrated circuits are usually organized in groups and banks and are simultaneously driven in parallel in order to keep the outlay for driving the modules using the tester unit low. All of the integrated circuits are thus essentially driven using common address and command lines. Since the data line, to which the integrated circuits of a group are connected, are likewise connected to the tester unit via a common data bus, special control signals are provided in order to successively read out the data, which need to be read out from the integrated circuits of the group, to the tester unit via the data bus. This is effected in a manner such that only one bank of data can be sent at a time to the tester unit.

The control signal is generally a circuit select signal (e.g., CS: chip select signal) which is provided for the purpose of activating and deactivating the respective integrated circuit. In order to provide this circuit select signal, tester channels are provided between each of the integrated circuits of the group and the tester unit. A respective integrated circuit of a plurality of groups is arranged to form banks, the integrated circuits of a bank each being activated and deactivated using a circuit select signal.

Since, in the case of the burn-in operation of encapsulated integrated circuits, the costs of the receptacles increase with the number of contacts required for testing, on account of the increased contact-making complexity, reducing the number of control lines is associated with a cost advantage.

Particularly in the case of the wafer-level burn-in operation in which the integrated circuits are tested on an unsawn wafer, it is necessary to reduce the number of connections between the tester unit and the wafer to an absolute minimum since such a test system requires a full-wafer contact-making device for the purpose of making contact with the integrated circuits. Such a full-wafer contact-making device is complex since it makes it possible to connect all of the integrated circuits of a wafer to the tester unit and thus may have many times 10,000 connections. The full-wafer contact-making apparatus is also susceptible to errors since the contact-making needles which are used to make contact with the individual contacts of the integrated circuits are very small and are thus sensitive to mechanical influences. The susceptibility to errors thus increases with the number of contact-making needles in the full-wafer contact-making apparatus, with the result that reducing the number of contact-making needles used reduces the susceptibility to errors and thus likewise saves costs.

SUMMARY OF THE INVENTION

Embodiments of the present invention provide an improved integrated circuit, a test system and a test method, wherein the number of tester channels may be reduced when testing the integrated circuit.

According to a first aspect of the present invention, provision is made of an integrated circuit having a test circuit for reading out an error datum from the integrated circuit. The error datum can be output via a first and a second data output of the integrated circuit. An address and a read command can be applied to the integrated circuit in order to read out the error datum associated with the address via one of the data outputs. The test circuit is configured in such a manner that, when a first read command is applied, it outputs the error datum at the first data output and switches the second data output to high impedance and, when a second read command is applied, the test circuit outputs the error datum at the second data output and switches the first data output to high impedance.

According to another aspect of the present invention, provision is made of a test system for testing a plurality of such integrated circuits. The integrated circuits are connected to a tester unit via common address and command lines in order to address memory areas for the purpose of reading out error data in order to test the integrated circuits in parallel. The error datum may be read out from a group of integrated circuits via a data line. The data output of a first integrated circuit of the group of integrated circuits is connected to the data line and the second data output of a second integrated circuit of the group of integrated circuits is connected to the data line.

The integrated circuit and the test system according to embodiments of the invention make it possible to dispense with a control line for driving the integrated circuit, which control line would otherwise be used to select the integrated circuit for the purpose of reading out the error data.

Integrated circuits are usually arranged in banks on a test board in order to be tested in parallel, all of the integrated circuits of a bank being connected to the tester unit using data lines which are separate from one another. The integrated circuits of a bank may be simultaneously activated or deactivated using a circuit select signal. Integrated circuits of another bank are essentially arranged parallel to said bank and can likewise be activated using a dedicated circuit select signal in order to read out the error data using the same data lines. The tester unit uses circuit select signals to prescribe which of the banks in the arrangement of integrated circuits is currently selected in order to read out an error datum of the integrated circuits via the respective data line. To this end, a plurality of circuit select lines corresponding to the number of existing banks are needed in conventional systems.

The test system according to embodiments of the invention now provides for a respective integrated circuit from each bank of a plurality of banks to be combined to form a group of integrated circuits which are connected to the tester unit via the same data line. However, embodiments of the invention provide for only the error datum of one of the integrated circuits of the group, rather than the error data of all of the integrated circuits of the group at the same time, to be applied to the data line when the address from which the respective error datum of the integrated circuit is intended to be read out is prescribed and when a read command is applied. If the read command is subsequently applied again, a further integrated circuit applies the error datum to the data line. During each read-out operation which is controlled by a read command, the data line is respectively connected only to an active data output of the integrated circuits. After a number of read commands corresponding to the number of integrated circuits of the group, all of the error data of the integrated circuits of the group have been applied to the data line which is connected to the group of integrated circuits.

The integrated circuits of the group of integrated circuits are connected to the data line in such a manner that, in the case of each read command, one of the integrated circuits outputs the error datum to the data line at a time. It is thus ensured that two integrated circuits do not output the respective error datum to the same data line at the same time. The remaining data outputs of the integrated circuits, which are not currently outputting the error datum to the data line, are switched to high impedance in this case in order to avoid disrupting the transmission of the error datum from the respective integrated circuit, which is connected to the data line and which is outputting the error datum to the data line, to the tester unit.

In order to switch the data outputs either to high impedance or in such a manner that the error datum is output, the integrated circuit has a driver circuit for each data output.

The driver circuit may respectively have a control input and a data input for applying the error datum in order, in accordance with a control signal that has been applied to the control input, to output the error datum which has been applied to the data input or to switch the data output to high impedance if the control input is completely isolated from a potential or if a particular control signal level is applied. This makes it possible to provide a suitable driver circuit for implementing such an integrated circuit according to embodiments of the invention.

An activation circuit may be connected to the control inputs of the driver circuits in order to output the control signal, in a test mode, when the first read command is applied, so that the error datum is output to the first driver circuit, and to completely isolate the second data output from a potential. When the second read command is applied, the control signal is also switched in such a manner that the error datum is output to a second driver circuit, while the first data output is switched to high impedance.

This means that, with each read command, the data outputs of the integrated circuits are cyclically switched in such a manner that a respective error datum of one of the integrated circuits is output at one of the data outputs, while the remaining data outputs are switched to high impedance.

The plurality of integrated circuits of the group of integrated circuits are connected to the data line in such a manner that the respective error datum to be output is successively applied to the data line. The error datum of the first integrated circuit, for example, is thus applied to the data line when the first read command is applied. In the case of a subsequent read command, the error datum of the second integrated circuit is correspondingly applied to the data line.

An activation circuit is provided which, in a normal operating mode, forwards the datum which has been applied to the respective data input to the data output via the driver circuit.

The integrated circuits may be connected on a test board which is connected to the tester unit via the address, command and data lines. Alternatively, the integrated circuits may also be arranged on an unsawn wafer, may be contacted using a full-wafer contact-making apparatus and are connected to the tester unit via the address, command and data lines.

According to another aspect of the present invention, provision is made of a method for reading out error data from integrated circuits which are to be tested together in a test system according to embodiments of the invention. In order to read out the error data at an address, an address and a read command are first of all applied to the integrated circuits in order to respectively read out the error datum associated with the address. A first read command and a second read command are successively applied to the integrated circuits so that the error datum of the first integrated circuit of the group of integrated circuits can be read out on the data line when the first read command is applied. When the second read command is applied, the error datum is read out from the second integrated circuit of the group of integrated circuits.

The method according to embodiments of the invention has the advantage that the respective circuit select signals for activating and deactivating the integrated circuits of a group can be dispensed with.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 4A-F illustrate the operation of driving the driver circuits according to one embodiment of the invention.

DETAILED DESCRIPTION OF THE PREFERRED EMBODIMENT

Figure 1:
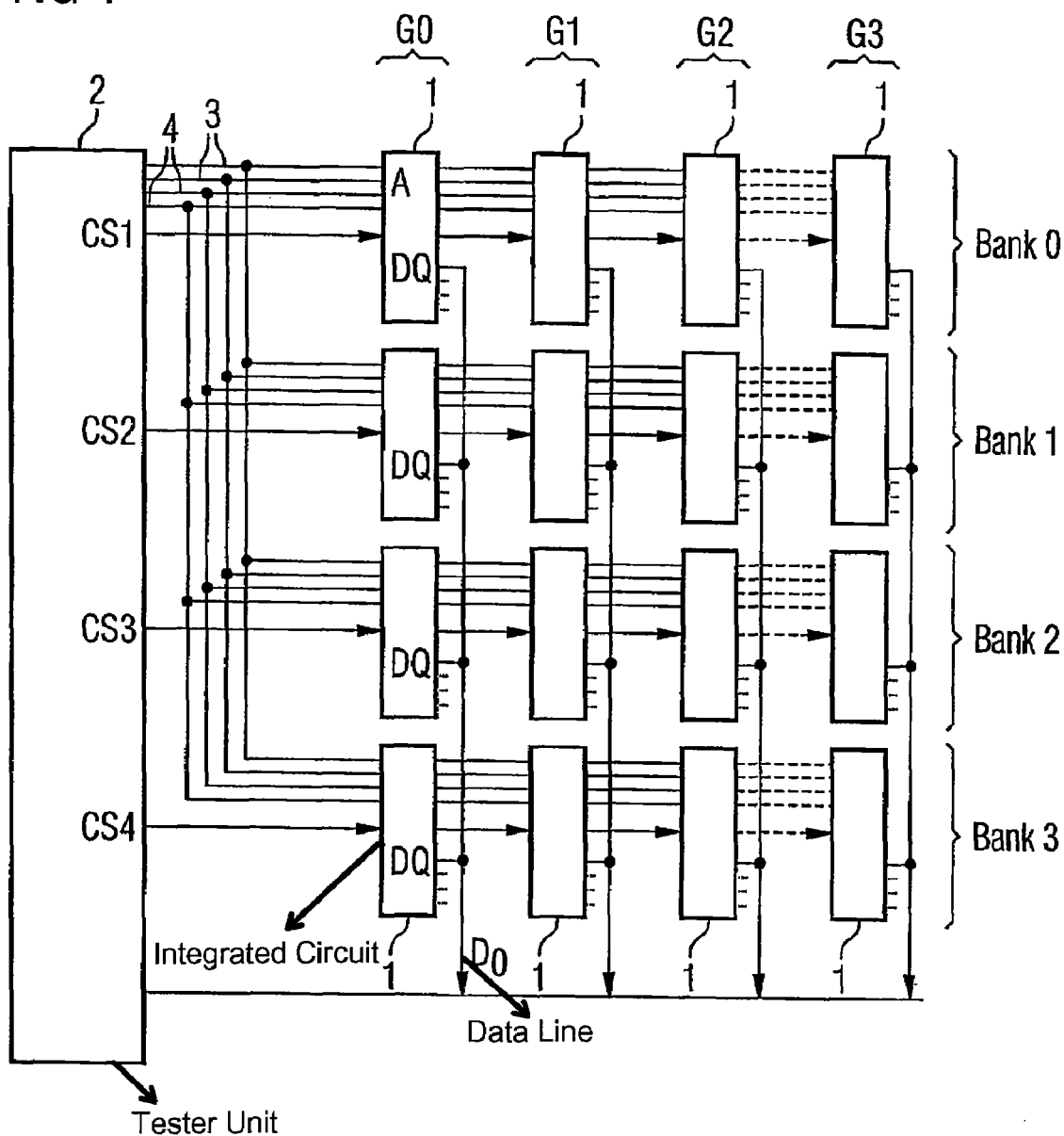
FIG. 1 shows a test system for testing a plurality of integrated circuits according to the prior art.

FIG. 1 illustrates a test system according to the prior art. The test system is used to test a number of integrated circuits 1 as simultaneously as possible for errors. To this end, the integrated circuits 1 are connected to a tester unit 2 so that the addresses which are provided by the tester unit 2 are made available, via address lines 3, to all of the connected integrated circuits and test commands which are provided by the tester unit 2 are made available, via corresponding command lines 4, to all of the integrated circuits 1.

FIG. 1 illustrates, by way of example, a test system having 16 integrated circuits 1 which are to be tested by the tester unit 2. It can be seen that each of the integrated circuits 1 is connected, in a parallel manner, to the same address and command lines 3, 4. The integrated circuits 1 are organized in banks Bank0-Bank3 and groups G0-G3, each bank having four integrated circuits 1 and each group likewise having four integrated circuits in the example shown.

The integrated circuits 1 of a group G0-G3 are illustrated in a manner such that they are arranged beneath one another, a respective data output DQ of the integrated circuits 1 of a group being connected to the tester unit 2 via a common data line D0. In the example shown, each integrated circuit 1 of the group has four data outputs DQ0, DQ1, DQ2, DQ3, only one of which is used to output error data. Each group G0-G3 of integrated circuits 1 is connected to the tester unit 2 via the data line D0. The data line D0 is connected to the first data outputs DQ0 of the integrated circuits in such a manner.

So that, during the test operation, when reading out an error datum, not all of the integrated circuits 1 of a group G0-G3 apply the error datum to the data line D0 and thus give rise to data contention, the individual integrated circuits 1 of the group G0-G3 are activated using a respective circuit select signal CS1 to CS4. This circuit select signal CS1-CS4 is provided by the tester unit 2 either directly or in coded form, only one of the circuit select signals CS1 to CS4 ever being activated at a time and the respective other circuit select signals CS1-CS4 being deactivated. If a circuit select signal CS1-CS4 is activated, the respective integrated circuit 1 can receive the applied address and the applied test commands and can correspondingly output error data via the data output DQ0 in the case of a read command.

The fact that only one of the circuit select signals CS1-CS4 is ever activated at a time prevents a plurality of integrated circuits 1 from simultaneously trying to output an error datum via the data line D0. Parallelism when testing the integrated circuits 1 is increased by arranging a plurality of groups G0-G3 in parallel, each group having its own data line D0. The integrated circuits 1 are essentially organized in the same manner in each group, with the result that each first integrated circuit 1 of a group can be activated using the first circuit select signal CS1, each second integrated circuit of a group can be activated using the second circuit select signal CS2, etc. The integrated circuits 1 may be situated both in the unsawn state on a wafer which is contacted using a full-wafer contact-making apparatus and on a test board which uses receptacle contacts to hold the integrated circuits and to make contact with them in this manner.

Figure 2:
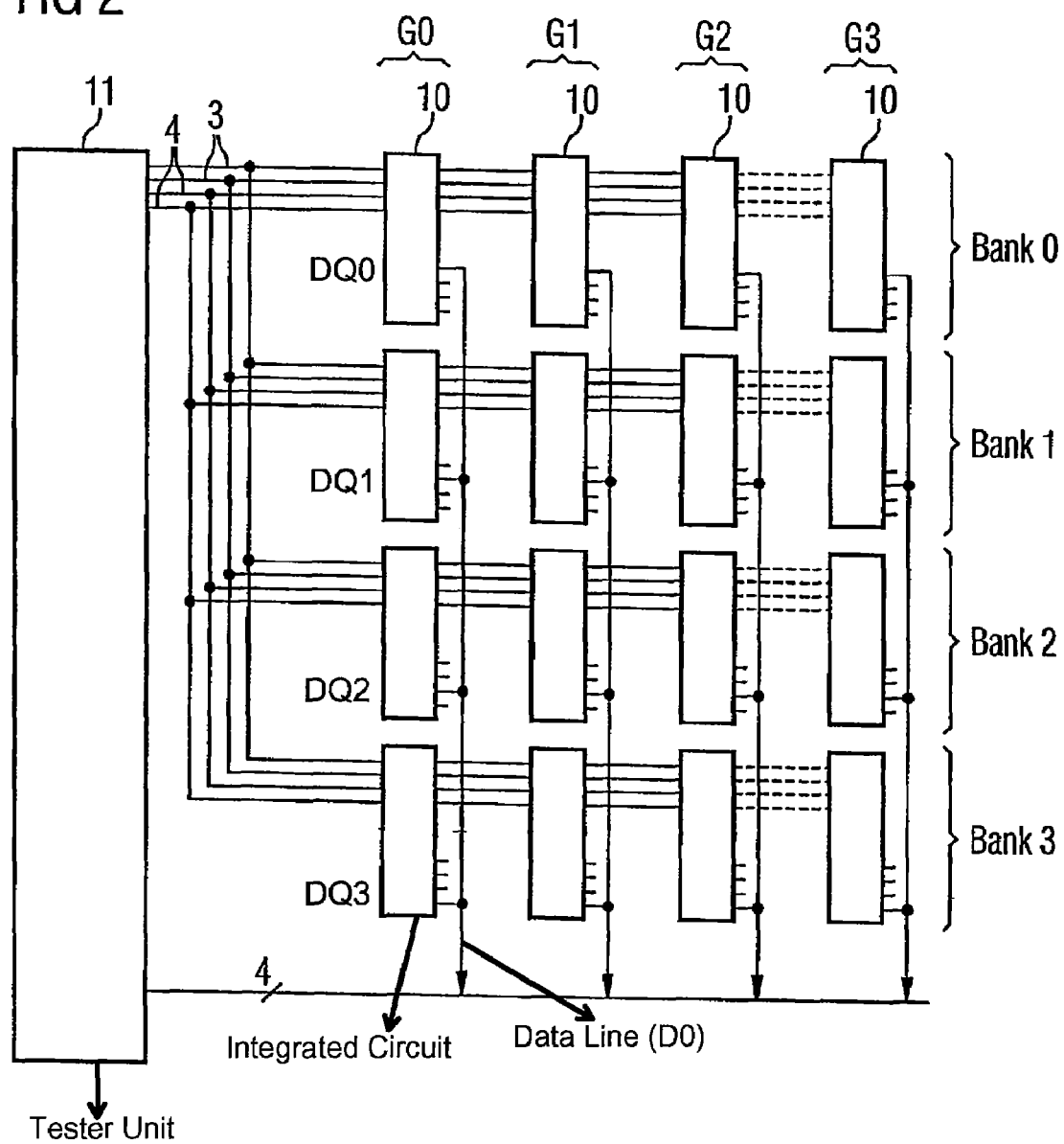
FIG. 2 shows a test system according to one embodiment of the invention.

FIG. 2 illustrates a test system according to a first embodiment of the invention. A test system in which 16 integrated circuits 10, in particular memory circuits, are to be simultaneously tested is illustrated. This example is not intended to restrict the number of integrated circuits 10 of the test system to 16. The test system according to the invention has integrated circuits 10 which are to be tested using a tester unit 11. Each of the integrated circuits 10 is connected to the tester unit 11 via corresponding address and command lines 3, 4 so that an address which has been applied by the tester unit 11 and a test command which has been applied by the tester unit 11 are applied to all of the integrated circuits.

Each of the integrated circuits 10 has data outputs DQ0 to DQ3 which are each connected to the data line D0 of each group. In this case, the first data output DQ0 of the first integrated circuit of the group, the second data output DQ1 of the second integrated circuit, the third data output DQ2 of the third integrated circuit and the fourth data output DQ3 of the first integrated circuit are respectively connected to the data line D0.

The integrated circuits 10 are connected in such a manner that their circuit selection inputs CS are permanently activated and in such a manner that the integrated circuits 10 are activated in order to receive the applied addresses and test commands. If an address is applied to the integrated circuits and a read command for reading out error data is applied, the integrated circuits 10 output the error datum at their first data outputs DQ0. This means that, in a group, the error datum of the first integrated circuit is applied to the data line D0. As a result of the fact that the remaining data outputs, namely the data outputs DQ1, DQ2 and DQ3, of all of the integrated circuits of the group are switched to high impedance, the error datum applied to the data line is not impaired by any further data signals which are applied to the data line. When the read command is again applied to the integrated circuits, for example according to a clock signal, the first data outputs DQ0 of the integrated circuits are switched to high impedance, and the respective error datum of the integrated circuits of the group is applied to the second data output DQ1. The remaining data outputs are switched to high impedance. This makes it possible, in the example illustrated, to successively read out the error datum of the first, second, third and fourth integrated circuits of the group by applying the read command four times.

The tester unit serially receives the error data of the integrated circuits and can assign the error data which have been received in this manner to the respective integrated circuit 10.

Figure 3:
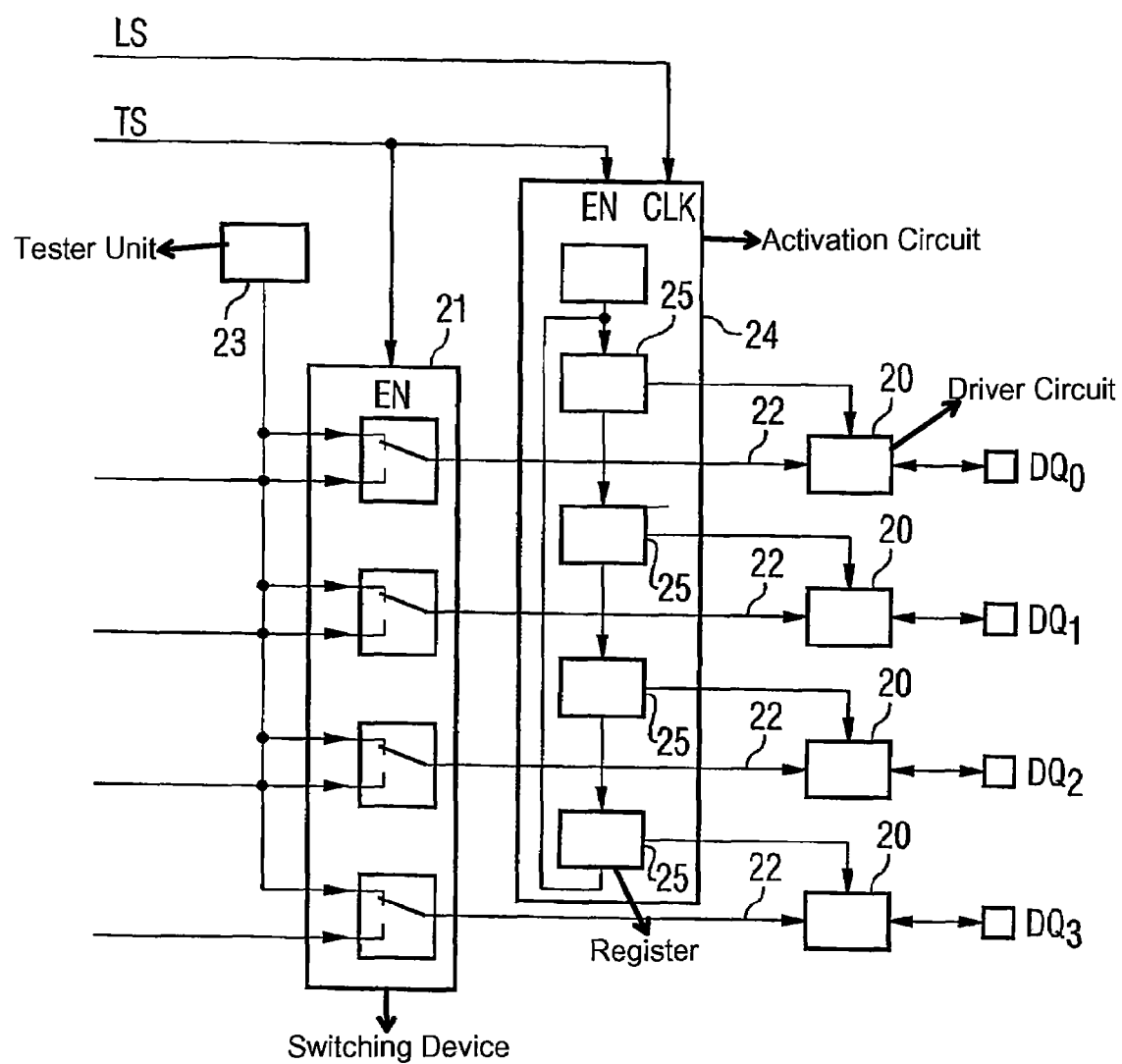
FIG. 3 shows a test circuit in an integrated circuit according to one embodiment of the invention.

FIG. 3 illustrates part of an integrated circuit 10 according to one embodiment of the invention. The integrated circuit 10 has driver circuits 20 which drive the data to the data outputs DQ0 to DQ3. In a test mode which is indicated by a test signal TS, a switching device 21 is switched in such a manner that, instead of a regular data signal which can be output via the data outputs DQ0-DQ1 during normal operation, the driver circuits 20 are provided with an error datum via data lines 22. The error datum is provided by a test unit 23 which determines the error data on the basis of the applied address by comparing data which have been written to a memory with data which have been read out from a memory. An activation circuit 24 which is in the form of a shift register is likewise driven on the basis of the test signal TS. The activation circuit 24 is activated when the test mode, which is indicated by the test signal, is assumed. The fact that error data are to be read out is indicated using a read command signal LS which is likewise made available to the activation circuit 24.

The activation circuit 24 has registers 25 which are connected to form a shift register and whose outputs are connected to the driver circuits 20. Depending on the content of the registers 25, this driver circuit 20 is switched in such a manner that the data signal which has been applied to the respective data line 22 is forwarded to the respective data output DQ0 to DQ3 or the respective data output DQ0 to DQ3 is switched to high impedance. By way of example, it may be provided that, if a logic "1" is stored in the respective register 25, the driver circuit 20 forwards the applied datum to the data output DQ0 to DQ3 and, in the case of a logic "0", the driver circuit 20 switches the respective data output DQ0 to DQ3 to high impedance. The registers 25 may also be configured in such a manner that they output a logic "1" in the activating state and are switched to high impedance in the non-activating state. The driver circuits 20 are then configured in such a manner that they connect the data output DQ0 to DQ3 to the corresponding registers 25 as soon as the latter have been switched to high impedance.

If a read signal is applied, the first register (viewed from the top) is activated so that the error datum is switched through to the first driver circuit 20 (viewed from the top), with the result that the error datum is applied to the first data output DQ0. The remaining driver circuits 20 are switched in such a manner that the second, third and fourth data outputs DQ1, DQ2, DQ3 are switched to high impedance. Applying the next read command generates a further read command signal LS, with the result that the first register 25 is now deactivated again and the following second register 25 is activated. This results in the corresponding second bit of the error datum now being applied to the second data output DQ1, while the remaining data outputs DQ0, DQ2, DQ3 are switched to high impedance.

FIG. 4A-F illustrate a sequential and cyclical manner in which each of the data outputs is successively switched, on the basis of the applied read command, in such a manner that the corresponding bit of the error datum, which is to be read out, is applied. A logic "1" switches the respective driver circuit in such a manner that the bit of the error datum is passed through, and a logic "0" switches the relevant driver circuit 20 to high impedance. The logic "1" is advanced to the next register 25 with each read command LS (from an initial state shown in FIG. 4A, sequentially and cyclically through FIGS. 4B-4F). In this manner, the error data of the integrated circuits are successively output to the data line D0.

The read command is prescribed by the tester unit, i.e., externally. A number of read commands corresponding to the number of integrated circuits are thus generated overall for each address.

While the foregoing is directed to embodiments of the present invention, other and further embodiments of the invention may be devised without departing from the basic scope thereof, and the scope thereof is determined by the claims that follow.

What is claimed is:

1. An integrated circuit, comprising
   a test circuit for reading out error datum from the integrated circuit in accordance with a test mode; and
   a first data output for outputting a first bit of the error datum and a second data output for outputting a second bit of the error datum, wherein a first read command and a second read command are applied to the integrated circuit to read out the error datum,
   wherein the test circuit is configured to output the first bit of the error datum at the first data output and switch the second data output to high impedance when the first read command is applied, and output the second bit of the error datum at the second data output and switch the first data output to high impedance when a second read command is applied.

2. The integrated circuit as claimed in claim 1, further comprising a respective driver circuit provided for each of the first and second data outputs, wherein each respective driver circuit is selectively switched to provide a high impedance and output respective one of the first and second bit of error datum which is applied to the driver circuit.

3. The integrated circuit as claimed in claim 2, wherein each driver circuit comprises a control input and a data input, wherein the error datum which has been applied to the data input is output when an active signal is applied to the control input and wherein the data output is switched to high impedance when the control input is completely isolated from a potential and when a passive signal is applied to the control input.

4. The integrated circuit as claimed in claim 3, wherein the test circuit comprises an activation circuit connected to the control inputs of the driver circuits, wherein the activation circuit is configured to output the active signal to the first driver circuit, in a test mode, when the first read command is applied, and to isolate the second data output from a potential, and wherein the activation circuit is configured to output the active signal to the second driver circuit, when the second read command is applied, and to switch the first data output to high impedance.

5. The integrated circuit as claimed in claim 4, wherein, in a normal operating mode, the activation circuit forwards a regular datum which has been applied to the respective data input to the data output.

6. The integrated circuit of as claimed in claim 5, wherein the test circuit further comprises a test unit configured to determine error datum for an applied address.

7. The integrated circuit of as claimed in claim 6, wherein the test circuit further comprises a switching device configured to apply the error datum from an output of the test unit, when a test mode signal is applied to the switching device, to the data inputs of the driver circuits.

8. The integrated circuit of as claimed in claim 7, wherein the activation circuit is configured to operate in the test mode when the test mode signal is applied to the activation circuit.

9. The integrated circuit of as claimed in claim 8, wherein the activation circuit comprises a plurality of registers configured as a shift register, wherein outputs of the registers are respectively connected to the respective driver circuits, wherein the respective driver circuits are switched based on the outputs of the registers.

10. The integrated circuit of as claimed in claim 9, wherein the shift register is configured to shift values stored in the shift register as each read command is received.

11. A test system for testing a plurality of integrated circuits, comprising:
    a tester unit connected to the plurality of integrated circuits via common address and command lines to address memory areas for reading out error data in order to test the integrated circuits in parallel, wherein an error datum is read out from each integrated circuit of the plurality of integrated circuits via a corresponding data line, wherein a first data output and a second data output of each integrated circuit is connected to the corresponding data line, wherein a first bit of the error datum is outputted at the first data output and the second data output is switched to high impedance when a first read command is applied to each integrated circuit, and a second bit of the error datum is outputted at the second data output and the first data output is switched to high impedance when a second read command is applied to each integrated circuit.

12. The test system as claimed in claim 11, further comprising a test board for connecting to the integrated circuits, wherein the test board is connected to the tester unit via the address, command and data lines.

13. The test system as claimed in claim 11, further comprising a full-wafer contact-making apparatus, wherein the integrated circuits are arranged on an unsawn wafer and are connected to the tester unit via the address, command and data lines using the full-wafer contact-making apparatus.

14. A method for reading out error data from a group of integrated circuits which are to be tested together in a test system, each integrated circuit comprising a first data output and a second data output, the method comprising:
    applying an address and a plurality of read commands to the group of integrated circuits to respectively read out error datum of each integrated circuit associated with the address,
    wherein a first read command and a second read command are successively applied to the group of integrated circuits, and wherein a first bit of the error datum is outputted at the first data output and the second data output is switched to high impedance when the first read command is applied to each integrated circuit, and a second bit of the error datum is outputted at the second data output and the first data output is switched to high impedance when the second read command is applied to each integrated circuit.

15. The method of claim 14, further comprising:
applying a test mode signal to activate a test unit in each integrated circuit, wherein the test unit is configured to determine the error data datum for the applied address.

16. The method of claim 15, wherein the test mode signal is also applied to a switching device in each integrated circuit, wherein the switching device switches the first data output and the second data output of each integrated circuit between the error datum and a regular datum.

17. The method of claim 16, wherein a respective driver circuit is provided for each data output of each integrated circuit, wherein each respective driver circuit is selectively switched to provide a high impedance and to output the error datum which is applied to the respective driver circuit.

18. The method of claim 17, wherein the test mode signal is also applied to an activation circuit of each integrated circuit, wherein the activation circuit is configured to control each respective driver circuit of each integrated circuit, based on each received read command, to successively output the error datum which is applied to the respective driver circuit and to provide a high impedance when not outputting the error datum.

19. The method of claim 18, wherein the activation circuit comprises a plurality of shift registers configured as a shift register, wherein values of the shift register are shifted for each read command received.

* * * * *